United States Patent
Rushkin et al.

(10) Patent No.: US 7,132,205 B2
(45) Date of Patent: Nov. 7, 2006

(54) POSITIVE PHOTOSENSITIVE RESIN COMPOSITIONS

(75) Inventors: Ilya Rushkin, Walpole, MA (US); Ahmad A. Naiini, East Greenwich, RI (US); Richard Hopla, Cranston, RI (US); Pamela J. Waterson, Northbridge, MA (US); William D. Weber, Rumford, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/860,784

(22) Filed: Jun. 3, 2004

(65) Prior Publication Data

US 2004/0253542 A1    Dec. 16, 2004

(51) Int. Cl.
*G03F 7/004* (2006.01)
*G03F 7/30* (2006.01)

(52) U.S. Cl. ............... 430/18; 430/270.1; 430/320; 430/326; 430/330; 430/906

(58) Field of Classification Search ............. 430/270.1, 430/906, 326, 330, 18, 320
See application file for complete search history.

(56) References Cited

U.S. PATENT DOCUMENTS

| | | | |
|---|---|---|---|
| 6,143,467 A * | 11/2000 | Hsu et al. ............... | 430/270.1 |
| 6,232,032 B1 * | 5/2001 | Nunomura et al. ......... | 430/191 |
| 6,436,593 B1 * | 8/2002 | Minegishi et al. ........... | 430/18 |
| 2003/0087190 A1 * | 5/2003 | Sezi ....................... | 430/283.1 |
| 2003/0099904 A1 * | 5/2003 | Sezi ....................... | 430/283.1 |
| 2003/0134226 A1 * | 7/2003 | Sezi ....................... | 430/270.1 |
| 2004/0142275 A1 * | 7/2004 | Komatsu ................. | 430/270.1 |

\* cited by examiner

*Primary Examiner*—John S. Chu
(74) *Attorney, Agent, or Firm*—Ohlandt, Greeley, Ruggiero & Perle, LLP

(57) ABSTRACT

An end-capped polybenzoxazole precursor having acid labile functional groups, positive working photosensitive compositions thereof and use of the compositions for producing heat resistant relief images on substrates.

43 Claims, No Drawings

POSITIVE PHOTOSENSITIVE RESIN COMPOSITIONS

FIELD OF THE INVENTION

The present invention relates to positive photosensitive resin composition suitable for use in microelectronic applications. More particularly, the present invention relates to a novel polybenzoxazole (PBO) precursor, a chemically amplified positive working photosensitive composition utilizing said novel PBO precursor, and a process for preparing heat-resistant relief structures using the photosensitive composition.

BACKGROUND OF THE INVENTION

Conventional positive-working photosensitive polybenzoxazole compositions contain an alkaline soluble PBO precursor and a diazoquinone photoactive compound as disclosed in U.S. Pat. No. 4,371,685. The diazoquinone compound inhibits the solubility of PBO precursor in an aqueous base. However after exposure to light, the diazoquinone compound undergoes photolysis and converts to indene carboxylic acid, which promotes solubility of the PBO precursor in the aqueous base.

The chemically amplified positive-working photosensitive polybenzoxazole compositions containing a PBO precursor in which some of the phenol groups were protected with acetal protecting groups, and a compound which produces acid upon exposure to radiation (PAG) was disclosed in U.S. Pat. No. 6,143,467. After irradiation with light of appropriate wavelength, the PAG produces acid, which removes the acetal protecting group from the phenol moiety. This process promotes dissolution of the PBO precursor in aqueous base. However, the PBO precursor described in U.S. Pat. No. 6,143,467 contains amino end groups, which react with photolitically produced acid and slows photospeed. The PBO precursor of the present invention does not have amino end groups, which significantly improves the imaging performance of the chemically amplified formulation disclosed in the present invention.

US 2003/0087190 A1 describes an end capped PBO precursor in which some of the hydroxyl groups on the polymer backbone were blocked by tert-butoxycarbonyl moieties the present invention relates to end capped PBO precursors blocked with different moieties.

BRIEF SUMMARY OF THE INVENTION

The present invention relates to an end-capped polybenzoxazole precursor (I) bearing acid labile functional groups that has the general formula:

wherein $k^1$ can be any number between 0.1 and 2, $k^2$ can be any number between 0–1.9 provided that $(k^1+k^2)=2$; x is an integer from about 10 to about 1000, y is an integer from 0 to about 900 and $(x+y)<1000$; $Ar^1$ is a tetravalent aromatic, or heterocyclic group, or mixture thereof; $Ar^2$ is a divalent aromatic, heterocyclic, alicyclic or aliphatic group; $Ar^3$ is a divalent aromatic, aliphatic or heterocyclic group; $Ar^4$ can be $Ar^1(OD)_k^1(OH)_k^2$ or $Ar^2$; D is an acid sensitive group $R^1$ or a moiety $B-O-R^2$ containing an acid sensitive group $R^2$; R is an organic group having a carbonyl, carbonyloxy or sulfonyl group attached directly to the terminal NH of the polymer. The repeat units, containing $Ar^1$ and $Ar^2$ can be distributed randomly or in blocks in the polymer chain.

The present invention also relates to a heat resistant positive working photosensitive composition that comprises:

A. at least one polybenzoxazole precursor (I);

B. at least one photo-active material which releases acid upon irradiation (PAG); and C. at least one solvent.

Optionally, the photosensitive composition may contain a photosensitizer, an adhesion promoter, a leveling agent, or other additives.

The present invention also relates to the process for preparing heat-resistant relief structures from the aforementioned positive working photosensitive composition and the articles of manufacture obtained by the combination of the composition and the method of use according to the invention.

The heat resistant positive working photosensitive composition is spun on a substrate to create a film, which is subjected to patterning through a photolithographic process. After photolithographic processing, the patterned film is converted to a heat resistant polybenzoxazole relief image by application of additional heat. The photosensitive resin composition can be used as thermal and mechanical stress buffer coatings, alpha particle barrier films, interlayer dielectrics, and patterned engineering plastic layers in the manufacturing of microelectronic devices.

DETAILED DESCRIPTION OF THE INVENTION

The present invention relates to an end-capped polybenzoxazole precursor (I) bearing acid labile functional groups that has the Structure I:

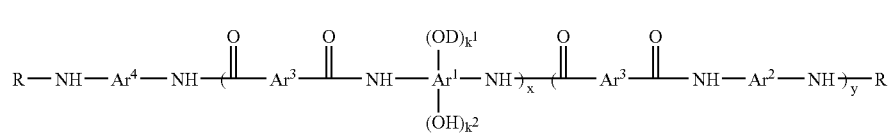

I

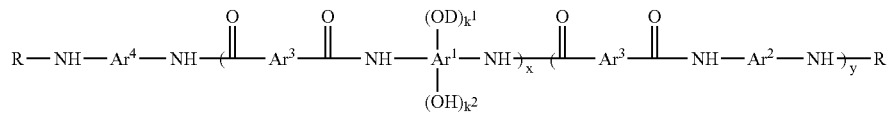

wherein $k^1$ can be any number between 0.1 and 2, $k^2$ can be any number between 0–1.9 provided that $(k^1+k^2)=2$; x is an integer from about 10 to about 1000, y is an integer from 0 to about 900 and $(x+y)<1000$; $Ar^1$ is a tetravalent aromatic, or heterocyclic group, or mixture thereof; $Ar^2$ is a divalent aromatic, heterocyclic, alicyclic or aliphatic group; $Ar^3$ is a divalent aromatic, aliphatic or heterocyclic group; $Ar^4$ can be $Ar^1(OD)_k^1(OH)_k^2$ or $Ar^2$; D is an acid sensitive group $R^1$ or a moiety (B—O—$R^2$) containing an acid sensitive group $R^2$; R is an organic group having a carbonyl, carbonyloxy or sulfonyl group attached directly to the terminal NH of the polymer.

In Structure I, $Ar^1$ is a tetravalent aromatic group or a tetravalent heterocyclic group, or mixtures thereof. Examples of $Ar^1$ include, but are not limited to, the following structures:

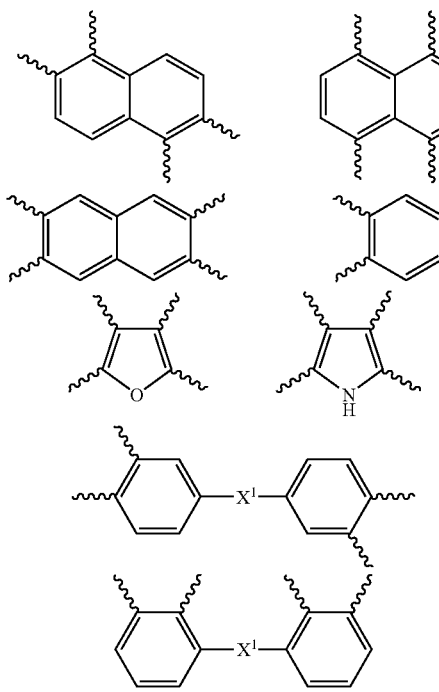

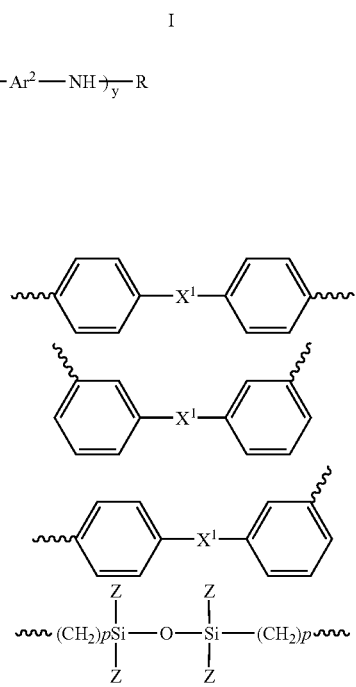

wherein $X^1$ is —O—, —S—, —C(CF$_3$)$_2$—, —CH$_2$—, —SO$_2$—, —NHCO— or —SiR$^a_2$— and each $R^a$ is independently a $C_1$–$C_7$ linear or branched alkyl or $C_5$–$C_8$ cycloalkyl group. Examples of $R^a$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl. A mixture of two or more $Ar^1$ groups may be employed.

In Structure I, $Ar^2$ is a divalent aromatic, a divalent heterocyclic, a divalent alicyclic, or a divalent aliphatic group that may contain silicon. Examples of $Ar^2$ include but are not limited to

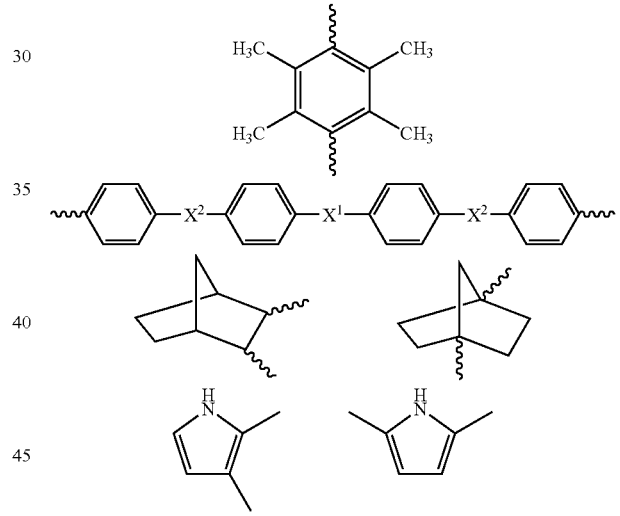

wherein $X^1$ is as defined before, $X^2$ is —O—, —S—, —C(CF$_3$)$_2$—, —CH$_2$—, —SO$_2$—, or —NHCO—, Z=H or $C_1$–$C_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl or cyclooctyl.

$Ar^3$ is a divalent aromatic, a divalent alicyclic, or a divalent heterocyclic group. Examples of $Ar^3$ include but are not limited to:

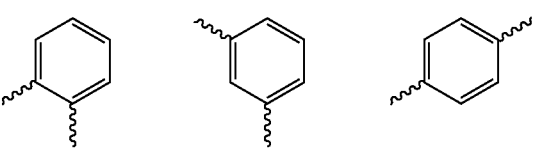

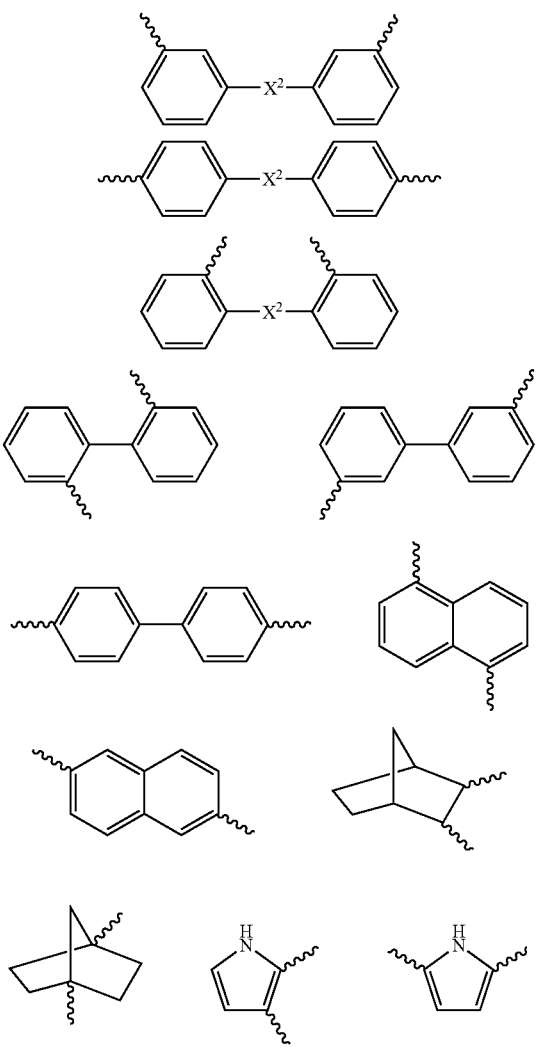

In Structure I, $Ar^4$ is $Ar^1(OD)_k{}^1(OH)_k{}^2$ or $Ar^2$.

R is a monovalent organic group having a carbonyl, carbonyloxy or sulfonyl group, which may be further substituted by other functional groups such as vinyl, carbonyl, ether ester, or carboxylic acids. Examples of R groups include, but are not limited to, the following structures:

D is an acid sensitive group $R^1$ or a moiety $B—O—R^2$ containing an acid sensitive group $R^2$. Examples of suitable $R^1$ groups include, but are not limited to the following groups:

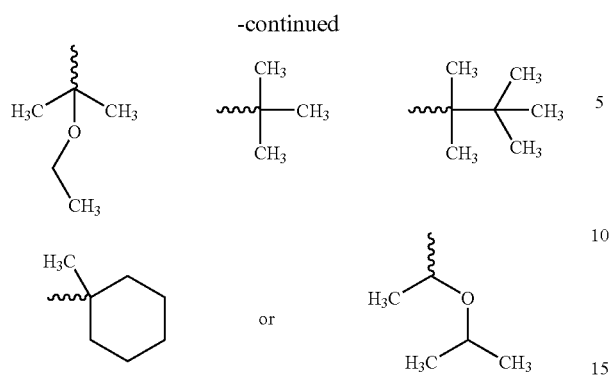

$R^1$ in combination with the O atom attached to $Ar^1$ forms groups such as acetal groups, ketal groups, ether groups, and silyl ethers groups. Mixtures of $R^1$ groups may be employed. The —$OR^1$ group should not be a carbonate group.

In B—O—$R^2$, B is any suitable divalent group which is not acid labile and $R^2$ is any acid labile group. Those skilled in the art will understand that after removal of $R^2$, the resultant B—OH moiety should be alkali solubilizing in aqueous base. Specific examples of B—O—$R^2$ include but are not limited to, the following structures:

$R^2$ in combination with the portions of B forms groups such as acetal groups, ketal groups, ether groups, silyl ethers groups, acid sensitive methylene ester groups (e.g. methylene t-butyl ester group), acid sensitive ester groups and carbonates. Mixtures of B and $R^2$ groups may be employed. When $R^1$ and $R^2$ are low activation energy groups (e.g. acetals), it is preferred that R not be derived from cyclic anhydrides.

Preferred $R^1$ are those which in combination with the O atom attached to $Ar^1$ form acetal groups. More preferred $R^1$ groups are:

Preferred B—O—$R^2$ are those, containing acetals or acid sensitive esters. More preferred B—O—$R^2$ groups include

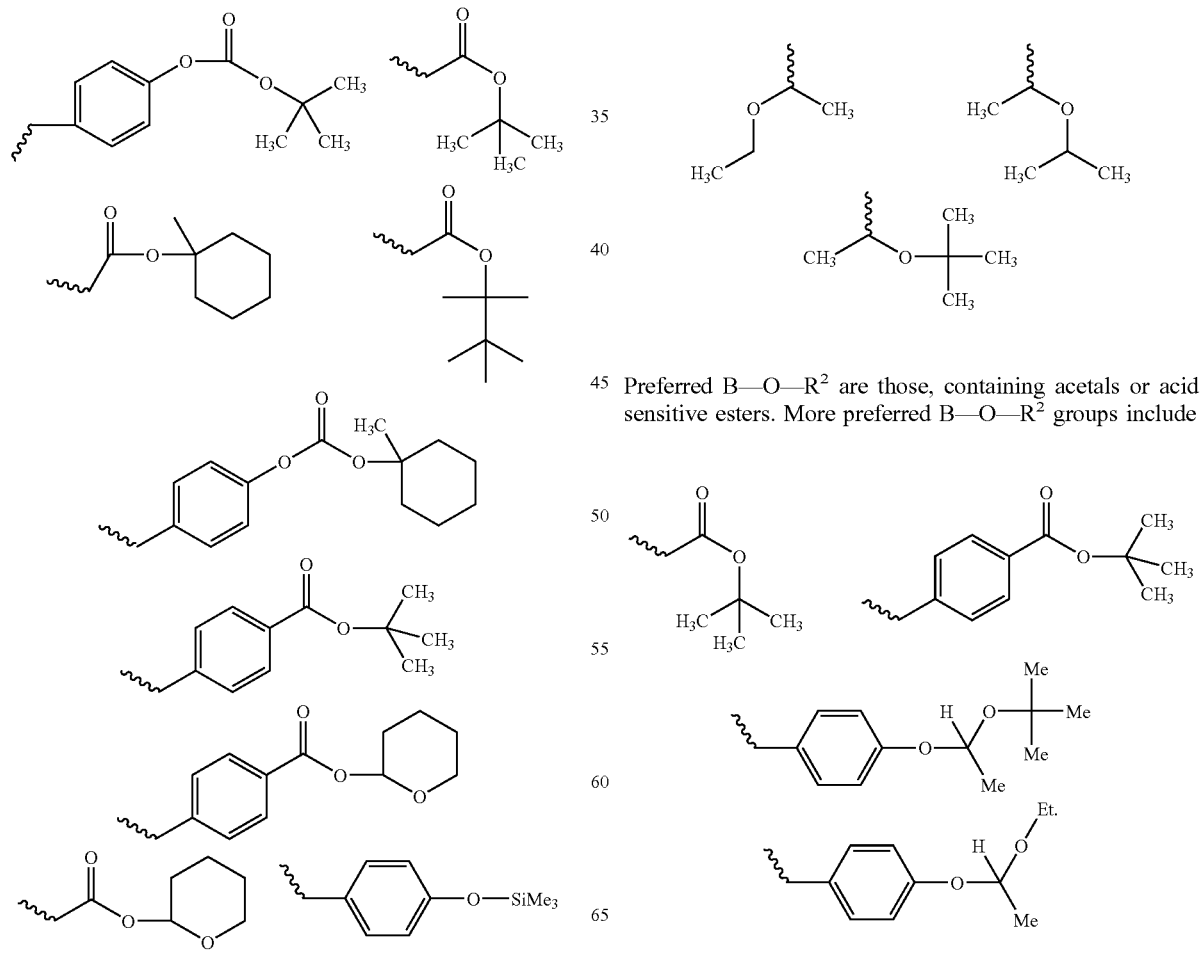

The first step in preparation of the PBO precursor (I) bearing acid labile functional group is reacting monomers (II), (III) and (IV) in the presence of base in suitable solvents.

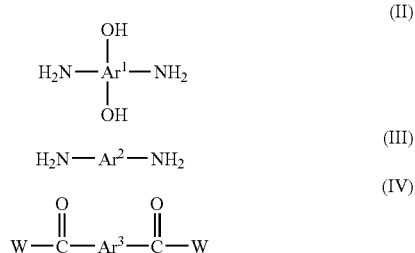

wherein W is Cl, $OR^b$ or OH and $Ar^1$, $Ar^2$ and $Ar^3$ are as previously defined.

Examples of (II) include but are not limited to 4,6-diaminoresorcinol, 3,3'-dihydroxy-4,4'-diaminodiphenylether, 3,3'-dihydroxybenzidine, hexafluoro-2,2-bis-3-amino-4-hydroxyphenylpropane and mixtures thereof.

The examples of (III) include but are not limited to 5(6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-amino-phenoxy)benzene, 1,4-bis (γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl)methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroanilne), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, 3,3'sulfonyl-dianiline, and mixtures thereof.

Monomers having the Structure IV are diacids, diacid dichlorides and diesters. Examples of suitable dicarboxylic acids (W=OH) include, but are not limited to, 4,4'-diphenyletherdicarboxylic acid, terephthalic acid, isophthalic acid and mixtures thereof. Examples of suitable diacid chlorides (W=Cl) include, but are not limited to, isophthaloyl dichloride, phthaloyl dichloride, terephthaloyl dichloride, 4,4'-diphenyletherdicarboxylic acid dichloride, and mixtures thereof. Examples of suitable dicarboxylic esters (W=$OR^b$) include but are not limited to: dimethylisophthalate, dimethylphthalate, dimethylterphthalate, diethylisophthalate, diethylphthalate, diethylterphthalate and mixtures thereof.

In the first synthetic step monomers having Structures (II) and (III) and (IV) can react to produce polybenzoxazole precursor base polymer (V) where $Ar^1$, $Ar^2$, $Ar^3$, and $Ar^4$ are as defined previously, except that if $Ar^4$ is derived from $Ar^1$, then $k^1=0$ and $k^2=2$.

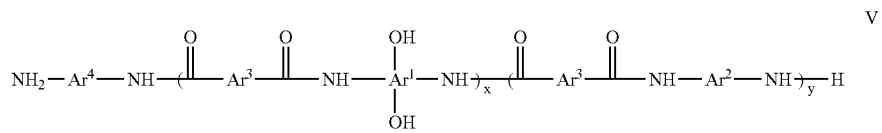

Any conventional method for reacting a dicarboxylic acid or its dichloride or diester with at least one aromatic and/or heterocyclic dihydroxydiamine, and optionally, with at least one diamine, may be used. Generally, the reaction for diacids (W=Cl) is carried out at about −10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0] undec-7-ene (DBU), 1,5-diazabicyclo[4.3.0]non-5-ene (DBN), dimethylpyridine, and dimethylaniline. The polybenzoxazole precursor base polymer V may be isolated by precipitation into water, recovered by filtration and dried. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure II, III, and IV are employed such that the ratio of [(II)+(III)]/(IV) is generally from about 1 to about 1.2. Preferably, the ratio of [(II)+(III)]/(IV) is generally from about 1 to about 1.1. The monomer having the Structure (II) is employed from about 10 to about 100 mole % of [(II)+(III)] and the monomer having Structure (III) is employed from about 0 to about 90 mole % of [(II)+(III)]. Distribution of the polymeric units resulting from monomers having the Structures II and III in the polybenzoxazole precursor base polymer (enclosed in brackets in Structures I and V), may be random or in blocks within it.

In Structure I and V, x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley&Sons, New York, 1983.

It should be noted that molecular weight and inherent viscosity of the polymers and therefore, x and y at a constant stoichiometry, can have a wide range depend on the reaction conditions such as the purity of the solvent, the humidity, presence or absence of a blanket of nitrogen or argon gas, reaction temperature, reaction time, and other variables.

In the second synthesis step, polybenzoxazole base polymer (V) is reacted with R-M to produce the polybenzoxazole precursor polymer (VI) where R is as described before and M is a reactive leaving group. Examples of M groups include, but are not limited to, Cl, Br, mesylate, triflate, substituted carbonyloxy groups, and substituted carbonate groups. Examples of suitable classes of R-M compounds include, but are not limited to, carbon and sulfonic acid chlorides, carbon and sulfonic acid bromides, linear and cyclic carbon and sulfonic acid anhydrides, and alkoxy or aryloxy substituted acid chlorides. Examples of suitable R-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyl-dicarbonate, dibutyldicarbonate, t-butyl chloroformate, ethyl chloroformate, n-butyl chloroformate, and methyl chloroformate. Further examples include compounds having the structures shown below.

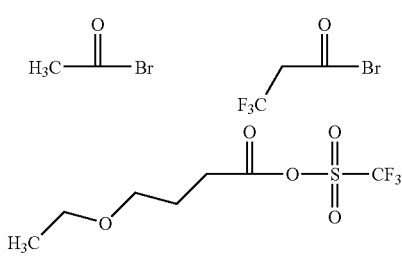

-continued

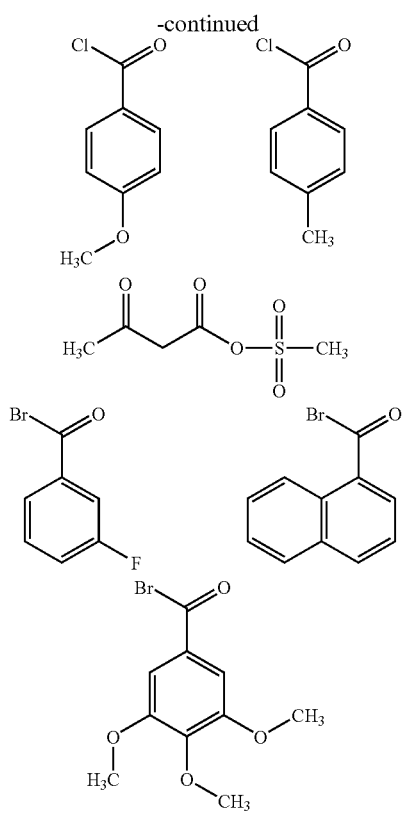

The reaction can be carried out in a suitable solvent by addition of R-M to a dry solution of the polybenzoxazole precursor base polymer at a temperature from about −25° C. to about 40° C. The more preferred temperature is from about 0° C. to about 25° C. The most preferred temperature is from about 5° C. to about 10° C. The reaction time is from about 1 hour to about 24 hours. The molar amount of RM employed is a slight molar excess (3–6%) of the sum of the molar amounts of monomer of structures II and III less the molar amount of monomer of structure IV. Addition of organic or inorganic base may also be employed. Examples of suitable organic amine bases include, but are not limited to pyridine, triethyl amine, 1,8-diazabicyclo[5.4.0]undec-7-ene (DBU), 1,5-diazabicyclo[4.3.0]non-5-ene (DBN), dimethylpyridine, and dimethylaniline. Examples of other suitable bases include sodium hydroxide, sodium carbonate, and sodium silicate.

The preferred reaction solvents are propylene glycol methyl ether acetate (PGMEA), N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

Some of the hydroxyl groups in the end capped PBO precursor (VI) then can be reacted to yield the acid sensitive end capped PBO precursor I. This may be accomplished in different ways depending on which acid sensitive moiety is employed or if the spacer group B is employed. For example, the acid sensitive end capped PBO precursor I may be prepared by an acid catalyzed addition reaction of vinyl ethers to produce the desired PBO precursor (I), in a process similar to the one described in U.S. Pat. No. 6,143,467. Any suitable acid catalyst may be used for the reaction, for example, hydrochloric acid, p-toluene sulfonic acid and pyridinium-p-toluene sulfonate. The acid catalyst may be added in amounts ranging from 0.001% (wt) to about 3.0% (wt). Several vinyl ethers with a range of activation energies towards acid induced deprotection can be used in this reaction. The examples of such vinyl ethers include but are not limited to ethyl vinyl ether, t-butyl vinyl ether, vinyl cyclohexyl ether, 2-ethylhexyl vinyl ether, dihydrofuran, 2-methoxy-1-propene, and dihydropyran.

PBO precursors (I) useful in this invention may also be prepared using a process consisting of the acid catalyzed reaction of an end-capped PBO precursor (VI), t-butyl vinyl ether and an alkyl-, alkylene-, cycloalkyl-, or arylalkyl alcohol as described for polymers derived from hydroxystyrene in U.S. Pat. No. 6,133,412.

A typical synthetic reaction mechanism for production of an acetal protected PBO precursor (I) is shown below:

Silyl group protected PBO precursor (I) may be prepared similarly by reacting the polymer with silyl halides under basic conditions. Ether (e.g. t-butyl) protected PBO precursor (I) may be prepared using standard synthetic procedures for the conversion of alcohol groups to ether groups.

After synthesis of 1, $k^1$ can be from about 0.1 to about 2. A preferred value for $k^1$ is from about 0.1 to about 1.5. A more preferred value for $k^1$ is from about 0.2 to about 1.2. The corresponding values for $k^2$ are $2-k^1$.

The present invention also relates to heat resistant positive working photosensitive composition that comprises:

A) at least one polybenzoxazole precursor (I);

B) at least one photoactive material which releases acid upon irradiation (PAG); and C) at least one solvent.

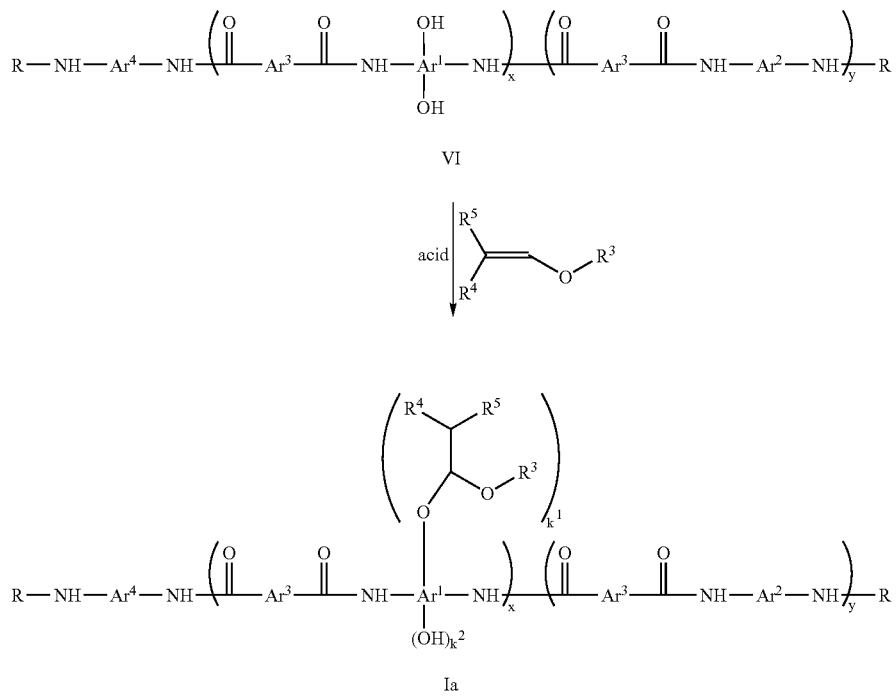

wherein R, D, $Ar^1$, $Ar^2$, $k^1$, $k^2$ and n are defined as before. Examples of $R^3$ include but are not limited to (a) a linear, branched or cyclic alkylene group preferably having 1 to 18 carbon atoms, (b) a linear, branched or cyclic haloalkylene group preferably having 1 to 18 carbon atoms, or (c) an arylalkylene group. Examples of $R^4$ and $R^5$ include but are not limited to hydrogen, linear, branched, or cyclic alkyl, linear or branched alkyl group bearing a cycloalkyl substituent, substituted cycloalkyl, aryl, and substituted aryl groups, preferably having 1 to 10 carbon atoms.

Another suitable method of deriving the PBO precursor (I) bearing acid labile functional groups, is from the reaction of the end-capped PBO precursor (VI) with t-butyl (or other tertiary acid sensitive group) bromoacetate in the presence of base as described for polymers containing hydroxystyrene units in U.S. Pat. No. 5,612,170. Benzyl bromides bearing acid sensitive substituents (e.g. t-butyl esters, carbonates, or alpha alkoxy esters) may be reacted in a similar fashion.

Optionally, the photosensitive composition may contain a photosensitizer, an adhesion promoter, a leveling agent, or other additives.

The positive working photosensitive composition of the present invention is based on photoacid-catalyzed cleavage of acid labile groups on the polybenzoxazole precursors (I). Polybenzoxazole precursor I has low solubility in the aqueous base due to the blocking of some of its phenolic functionalities. In the case of D=$R^1$ illustrated below, acid-catalyzed deblocking of these phenolic functionalities increases solubility of I in the aqueous base. The acid needed for this process is produced by decomposition of photo acid generator (PAG) under action of light. In this way a difference in solubility between exposed and unexposed areas is achieved:

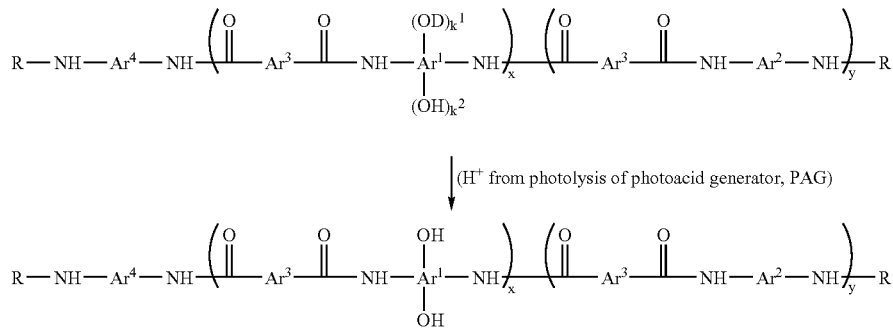

↓ (H⁺ from photolysis of photoacid generator, PAG)

In the case of D=B—OR², the difference in solubility between exposed and unexposed areas is achieved by removable of the R² group to deprotect the alkali solubilizing moiety B—OH as mentioned previously.

The positive-working formulation of the present invention uses photoactive compounds which release acid upon irradiation. Such materials are commonly called PhotoAcid Generators (PAGs). PAGs used in the present invention are preferably active to the radiation between about 300 nm to about 460 nm. They should form a homogeneous solution in the photosensitive composition and produce strong acid upon irradiation. Examples of such acids include hydrogen halides or a sulfonic acid. The classes of such PAGs include, but are not limited to, oxime sulfonates, triazines, diazoquinone sulfonates, or sulfonium or iodonium salts of sulfonic acids. Examples of suitable PAGs include but are not limited to:

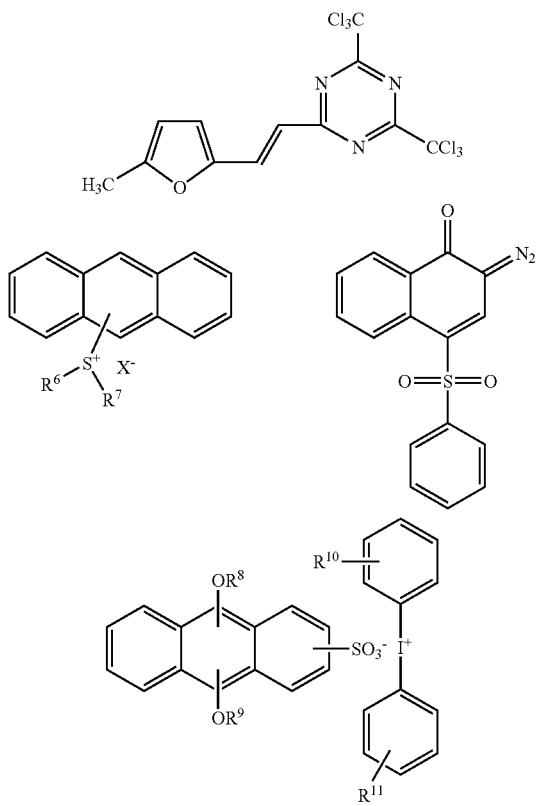

-continued

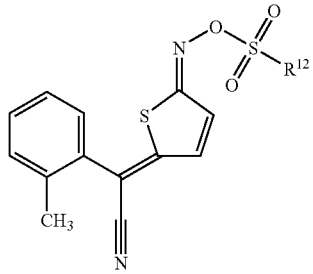

where $R^6$ and $R^7$ are each independently linear, branched or cyclic alkyl or aryl group containing 1 to 20 carbon atoms and $X^-$ is $R^{13}SO_3^-$ ($R^{13}$ is a substituted or unsubstituted, linear, branched or cyclic $C_1$–$C_{25}$ alkyl or a single or multinuclear aryl group having a total of from 6 to 25 carbons; $R^8$, $R^9$, $R^{10}$ and $R^{11}$ are independently linear, branched or cyclic alkyl groups and $R^{12}$ is a linear or branched $C_1$–$C_8$ alkyl, $C_5$–$C_8$ cycloalkyl, camphoroyl or toluyl group.

Alternatively, acid could be generated by a combination of PAG/sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558, 978 and 5,468,589 which are incorporated herein by reference. Other suitable photoacid generators are perfluoroalkyl sulfonyl methides and perfluoroalkyl sulfonyl imides as disclosed in U.S. Pat. No. 5,554,664.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzene-sulfonate.

Examples of sensitizers include but are not limited to: 9-methylanthracene, anthracenemethanol, acenaththalene, thioxanthone, methyl-2-naphthyl ketone, 4-acetylbiphenyl, 1,2-benzofluorene.

The positive photosensitive resin composition of the present invention contains one or more polybenzoxazole precursors (I) at about 10 wt. % to about 50 wt. % of the composition. Preferably, about 20 wt. % to about 45 wt. %, and most preferably, about 30 wt. % to 40 wt. % of the polybenzoxazole precursor (I) is present in the composition. Up to 25% of the amount of the polybenzoxazole precursor polymer of Structure I may be replaced by other organic solvent soluble, aqueous base soluble, aromatic or heterocyclic group polymers or copolymers.

Examples of organic solvent soluble, aqueous base soluble, aromatic or heterocyclic group polymers or copolymers may include polyimides, polybenzoimidazoles, polybenzothiazoles, polytriazoles, polyquinazolones, polyquinazolindiones, polyquinacridones, polybenxazinones, polyanthrazolines, polyoxadiazoles, polyhydantoins, polyindophenazines, or polythiadiazoles. Polyamic acids may also be employed as a co-resin, but preferably is employed only when a high-energy activation acid sensitive group (e.g. a tertiary ester) is employed on the polybenzoxazole precursor I.

The amount of PAG ranges from about 0.5 to about 20% (wt) based on amount of polybenzoxazole precursor. A preferred amount of PAG is from about 2 to about 15% (wt) based on the amount of polybenzoxazole precursor. A more preferred amount of PAG is from about 2 to about 10% (wt) based on the amount of polybenzoxazole precursor. The amount of optional sensitizer can be from about 0.1 to about 5% (wt) based on the amount of polybenzoxazole precursor.

The positive acting, photoactive resin of this invention is used in a solution dissolved in a solvent. The amount of solvent in the formulation can be from about 45% (wt) to about 87% (wt) of the photosensitive composition. The preferred amount is from about 50 to about 65% (wt). The solvent should not interfere with the photoacid generation from PAG or with the acid-catalyzed crosslinking reaction, should dissolve all components and should cast a good film. Suitable solvents include, but are not limited to organic solvents, such as gamma-butyrolactone (GBL), propylene glycol methyl ether acetate (PGMEA), methoxy ethyl ether and mixtures thereof. The preferred solvent is gamma-butyrolactone.

The positive chemically amplified resist formulation of the present invention can also contain other additives, such as, but not limited to, surfactants, dyes, time delay additives, profile enhancing additives, adhesion promoters, etc.

If employed, the amount of adhesion promoter may range from about 0.1 wt. % to about 5 wt. % based on the amount of polybenzoxazole precursor polymer. A preferred amount of adhesion promoter is from about 1 wt. % to about 5 wt. % based on the amount of polybenzoxazole precursor polymer. A more preferred amount of adhesion promoter is from about 2 wt. % to about 4 wt. % based on the amount of polybenzoxazole precursor polymer. Suitable adhesion promoters include, for example, alkoxysilanes, and mixtures or derivatives thereof. Examples of suitable adhesion promoters which may be employed in the invention may be described by Structure VII

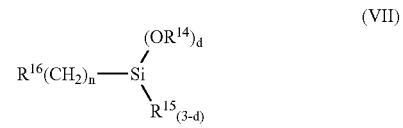

(VII)

wherein each $R^{14}$ is independently a $C_1$–$C_4$ alkyl group or a $C_5$–$C_7$ cycloalkyl group and each $R^{15}$ is independently a $C_1$–$C_4$ alkyl group, a $C_1$–$C_4$ alkoxy group, a $C_5$–$C_7$ cycloalkyl group or a $C_5$–$C_7$ cycloalkoxy group; d is an integer from 0 to 3 and n is an integer from 1 to about 6. $R^{16}$ is one of the following moieties:

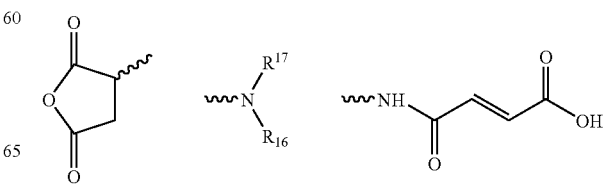

-continued

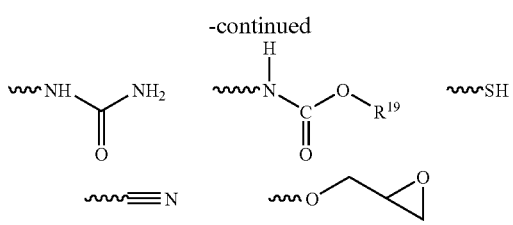

wherein each $R^{17}$ and $R^{18}$ are independently a substituted or unsubstituted $C_1$–$C_4$ alkyl group or a $C_5$–$C_7$ cycloalkyl group, and $R^{19}$ is a $C_1$–$C_4$ alkyl group and a $C_5$–$C_7$ cycloalkyl group. Adhesion promoters without amino groups, which may decrease photospeed, are preferred. Particularly preferred adhesion promoters are those wherein $R^{16}$ are

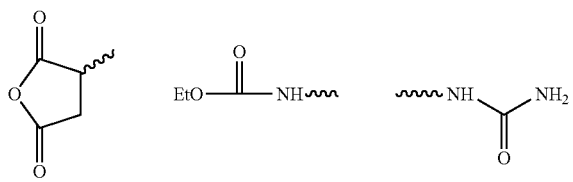

Examples of preferred adhesion promoters include, but are not limited to the following compounds.

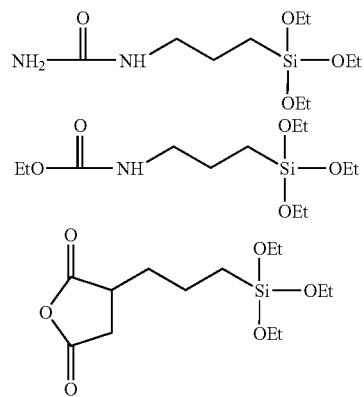

In addition, the present invention includes a process for forming a relief pattern. The process comprises the steps of: (a) providing a substrate, (b) coating on said substrate, a positive-working photosensitive composition comprising one or more polybenzoxazole precursors having the structure I, thereby forming a coated substrate; (c) exposing the coated substrate to actinic radiation; (d) post exposure baking the coated substrate at an elevated temperature; (e) developing the coated substrate with an aqueous base developer, thereby forming a developed relief pattern; and (f) baking the substrate at an elevated temperature, thereby curing the relief pattern.

Examples of suitable substrates include, but are not limited to, silicon wafers, compound semiconductor (III–V) or (II–VI) wafers, glass, quartz or ceramic substrates, or the like.

To ensure proper adhesion of the photosensitive composition to the substrate the substrate may be optionally treated before coating with an (external) adhesion promoter before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxalkoxysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are more preferred. Examples of suitable external adhesion promoters include, but are not limited to gamma-aminopropyltrimethoxy-silane, gamma-glycidoxypropylmethyldimethoxysilane, gamma-glycidoxypropyl-methyldiethoxysilane, gamma-mercaptopropylmethyldimethoxysilane, 3-methacryloxypropyldimethoxymethylsilane, and 3-methacryloxypropyltrimethoxysilane. gamma-Aminopropyltrimethoxysilane is more preferred. Additional suitable adhesion promoters are described in "Silane Coupling Agent" Edwin P. Plueddemann, 1982 Plenum Press, New York.

Coating methods include, but are not limited to, spray coating, spin coating, offset printing, roller coating, screen printing, extrusion coating, meniscus coating, curtain coating, and immersion coating. The resulting film may optionally be prebaked at an elevated temperature of about 70–150° C. for several minutes to half an hour, depending on the method, to evaporate the remaining solvent. Subsequently, the resulting film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

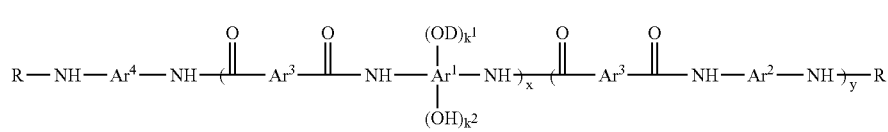

(I)

wherein $Ar^1$, $Ar^2$, D, R, $k^1$, $k^2$, n are defined as above; at least one PAG, and at least one solvent (all as described above), Following exposure to actinic radiation, it is advantageous to heat the coated substrate to a temperature between about 70° C. and 150° C. The coated substrate is heated in this temperature range for a short period of time, typically several seconds to several minutes. This process step is commonly referred to in the art as post exposure baking.

The film is developed using an alkali aqueous developer and a relief pattern is obtained. Examples of suitable aqueous alkali developers include but are not limited to an inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcohol-amines (e.g. triethanolamine), quaternary ammonium salts (e.g., tetramethylammonium hydroxide, tetraethylammonium hydroxide), and mixtures thereof. The most preferred developers are those containing tetramethylammonium hydroxide (TMAH). An appropriate amount of a surfactant can be added to the developer. Development can be carried out by means of immersion, spray, puddling, or other similar developing methods. The relief pattern is then rinsed using deionized water.

The benzoxazole ring is then formed by curing of the relief pattern to obtain the final pattern of high heat resistant polymer. Curing is performed by baking the developed substrate at or above the glass transition temperature $T_g$ of the polymer to obtain the benzoxazole ring that forms a final pattern of high heat resistance. The curing temperature can range from about 250° C. to about 400° C.

The application of the said polybenzoxazole films in semiconductor industry include, but are not limited to, stress relieve coatings for packaged semiconductors, alpha particle barrier films, interlevel dielectrics, insulating films and patterned engineering plastic layers. The examples of articles of commerce made using the disclosed formulation and method include, but not limited to memory devices, such as DRAMs, logic devices, such as microprocessors or microcontrollers, plating stencils, etc.

To illustrate the present invention, the following examples are provided. It should be understood that the present invention is not limited to the examples described.

SYNTHESIS EXAMPLE 1

Preparation of PBO Precursor with Amino End Groups (V)

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methyl-2-pyrrolidone (NMP) were added. The solution was stirred at room temperature until all solids dissolved, then cooled in an ice water bath at 0–5° C. To this solution, 39.3 g (194 mmol) of isophthalyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The polymer was dried under vacuum conditions at 105° C. for 24 hours. The yield was almost quantitative.

The inherent viscosity of the polymer was 0.201 dL/g measured in NMP at a concentration of 0.5 g/dL at 25° C. The number average molecular weight (Mn) was determined by gel permeation chromatography using four Phenogel 10 columns with pore sizes of $10^4$ Å, 500 Å, 100 Å and 50 Å and THF as an eluent. Polystyrene standards were used for calibration. The values obtained were Mn=5900 and Mw=17000.

SYNTHESIS EXAMPLE 2

Preparation of PBO Precursor with Acetyl End Groups (VI)

The PBO precursor obtained in Example 1 (100 g) was dissolved in 1000 g of Diglyme. Residual water was removed as an azeotrope with Diglyme using a rotary evaporator at 65° C. (10–12 torr). About 500 g of solvents was removed during the azeotropic distillation. The reaction solution was placed under a $N_2$ blanket, equipped with a magnetic stirrer and cooled using an ice bath down to ~5° C. Acetyl chloride (3.3 ml, 3.6 g) was added via syringe. The reaction was held on the ice bath for about 10 min. Then the ice bath was removed and the reaction was allowed to warm up over the period of 1 hr. Then, the mixture was again cooled to 5° C. on the ice bath. Pyridine (3.7 ml, 3.6 g) was added via syringe over the period of 1 hr. Reaction was kept on the ice bath for ~10 min, and then was allowed to warm up over the period of 1 hr. The reaction mixture was precipitated into 6 L of water with stirring. The polymer was collected by filtration and air dried overnight.

Then, the polymer was dissolved in 500–600 g of acetone and precipitated into 6 L of water/methanol (70/30). The polymer was again collected by filtration and air-dried for several hours. The wet polymer cake was dissolved in 700 g of THF and 70 ml of water. An ion exchange resin UP604 (40 g), available from Rohm and Haas was added and the solution was rolled for 1 hr. The ion exchange resin was removed by filtration. The final product was precipitated in 7 L of water, filtered, air-dried overnight followed by 24 hr drying in vacuum oven at 90° C. Yield: 100 g.

SYNTHESIS EXAMPLE 3

Preparation of PBO Precursor (I) Blocked with Ethyl Vinyl Ether

The polymer (100 g) obtained in Synthetic Example 2 was dissolved in 1000 g of Diglyme. Residual water was removed as an azeotrope with Diglyme using rotary evaporator at 65° C. (10–12 torr). About 500 g of solvents was removed during the azeotrope distillation. The reaction solution was placed under a $N_2$ blanket and equipped with a magnetic stirrer. Ethyl vinyl ether (9 mL) was added via syringe, followed by 6.5 ml of 1.5% (wt) solution of p-toluene sulfonic acid in PGMEA. The reaction mixture was stirred for 4 hrs at 25° C. and triethyl amine (1.5 ml) was added followed by ethyl acetate (500 ml). 250 ml of water was added and the mixture was stirred for about 30 min. Then the stirring was stopped and organic and water layers were allowed to separate. The water layer was discarded. The procedure was repeated 3 more times. Then, GBL (500 ml) was added and lower boiling point solvents were removed using rotary evaporator at 60° C. (10–12 torr). The solution was precipitated in 5 L of water. The product was collected by filtration and was dried in a vacuum oven at 45° C. overnight. Yield: 90 g.

$^1$H NMR showed that ~17% (mol) of OH groups in PBO precursor were blocked with ethyl vinyl ether. ($k^1$=0.34) Molecular weight values were determined as in Synthesis Example 1 (Mn=6600, Mw=17500).

SYNTHESIS EXAMPLE 4

Preparation of PBO Precursor (I) Blocked with T-Butyl Vinyl Ether

The polymer (8.6 g) obtained in Synthetic Example 2 was dissolved in 108 g of Diglyme. Residual water was removed as an azeotrope with Diglyme using rotary evaporator at 65° C. (10–12 torr). About 40 g of solvents was removed during the azeotrope distillation. The reaction solution was placed under a $N_2$ blanket and equipped with a magnetic stirrer. tert-Butyl vinyl ether (2.5 g) was added via syringe, followed by 1 ml of 1% (wt) solution of p-toluene sulfonic acid in PGMEA. The reaction mixture was stirred for 4 hrs at 25° C. and triethyl amine (1.5 ml) was added. The reaction mixture was precipitated into a mixture of 2 L of water with 5 mL of triethylamine. The precipitate was collected, redissolved in 200 g of THF, and again precipitated into a mixture of 2 L of water with 5 mL of triethylamine. The product was collected by filtration and was dried in a vacuum oven at 45° C. overnight. Yield: 5.7 g.

$^1$H NMR showed that ~50% (mol) of OH groups in PBO precursor were blocked with tert Butyl vinyl ether. ($k^1$=1) Molecular weight values were determined as in Synthesis Example 1 (Mn=7300, Mw=16700).

LITHOGRAPHIC EXAMPLE 1

Lithographic Evaluation of Blocked PBO Precursor (I)

A photosensitive formulation was prepared using 80 g of PBO precursor obtained in the way described in Example 3 and 4 g of a PAG of the following structure were mixed with 130 g of GBL in an amber bottle. The bottle was rolled for

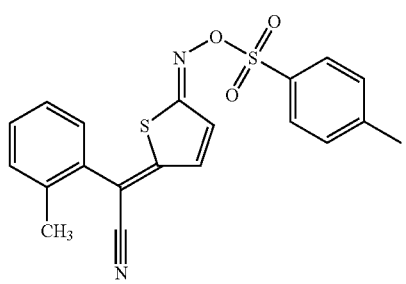

3 days and filtered through 1 μm Teflon filter to yield the photosensitive formulation.

One volume part of external adhesion promoter QZ3289 (solution containing 5% (wt) of gamma-aminopropyl triethoxysilane in 90% (wt) of ethanol and 5% (wt) of water, commercially available from Arch Chemicals) was mixed with 9 volume parts of isopropanol. The resulting solution was spin coated on a silicon wafer at 2000 rpm. Then, the photosensitive formulation prepared above was spin coated onto the prepared silicon wafer and baked on a hotplate for 3 minutes at 105° C. to obtain a film of about 8.5 μm in thickness. This film was exposed on a Canon 3000i4 I-line stepper baked again at 120° C. for 3 min and then developed for 150 seconds using a 0.262N aqueous TMAH solution followed by rinsing with deionized water to provide a relief pattern. Dark or unexposed film thickness retention was about 93%. At the exposure dose of 250 mJ/cm$^2$, 3 μm features were resolved.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

What is claimed is:

1. A photosensitive resin comprising:
an end-capped polybenzoxazole precursor polymer bearing acid labile functional groups having the structure I:

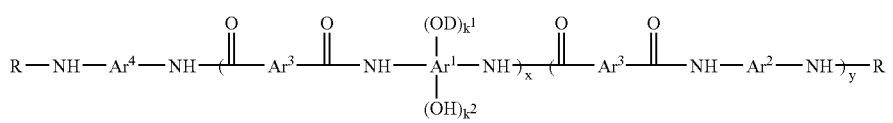

wherein $k^1$ is any number between 0.1 and 2, $k^2$ is any number between 0–1.9 provided that ($k^1$+$k^2$)=2; x is an integer from about 10 to about 1000, y is an integer from 0 to about 900 and (x+y)<1000; $Ar^1$ is selected from the group consisting of a tetravalent aromatic, a heterocyclic group, and mixture thereof; $Ar^2$ is selected from the group consisting of a divalent aromatic, heterocyclic, alicyclic and aliphatic group; $Ar^3$ is selected from the group consisting of a divalent aromatic, aliphatic and heterocyclic group; $Ar^4$ is selected from the group consisting of $Ar^1(OD)_k^1(OH)_k^2$ and $Ar^2$; D is selected from the group consisting of an acid sensitive group $R^1$ and a moiety (B—O—$R^2$) containing an acid sensitive group $R^2$; B is a divalent group which is not acid labile, R is an organic group having a carbonyl, carbonyloxy or sulfonyl group attached directly to the terminal NH of the polymer, and the —O$R^1$ group is not a carbonate group.

2. A photosensitive resin of claim 1 wherein $R^1$ in combination with the O atom attached to $Ar^1$ forms a group selected from the group consisting of acetal groups, ketal groups, ether groups, and silyl ethers groups.

3. A photosensitive resin of claim 1 wherein $R^1$ is selected from the group consisting of the groups

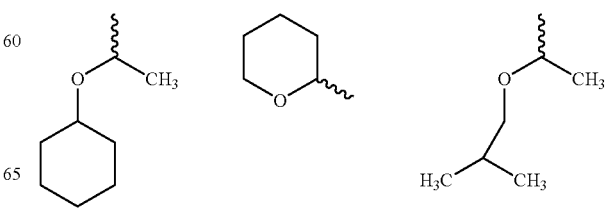

-continued

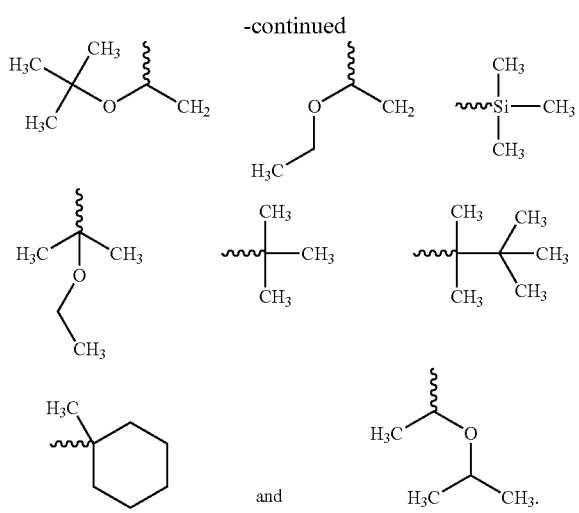

4. A photosensitive resin according to claim 1 wherein $R^2$ in combination with the portions of B forms a group selected from the group consisting of an acid sensitive acetal group and an acid sensitive ester group.

5. A photosensitive resin according to claim 1 wherein the group B—O—$R^2$ is selected from the group consisting of

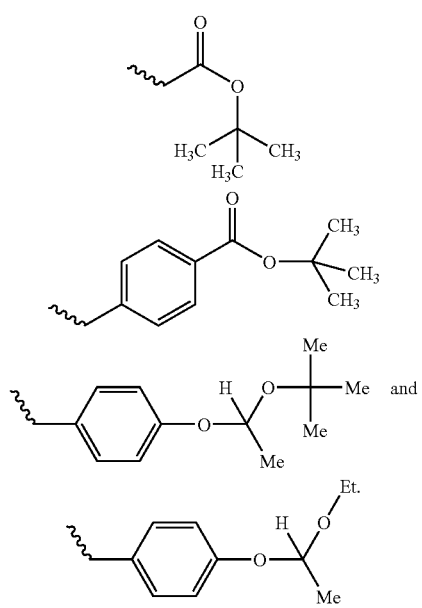

6. A photosensitive resin of claim 1 wherein $R^1$ in combination with the O atom attached to $Ar^1$ forms an acetal group and R is an organic group having a carbonyl group attached directly to the terminal NH of the polymer.

7. A positive-working photosensitive composition comprising:
an end-capped polybenzoxazole precursor polymer of claim 1;
a photoacid generator;
a solvent; and
optionally, a photosensitizer.

8. A positive-working photosensitive composition of claim 7 wherein $R^1$ in combination with the O atom attached to $Ar^1$ forms a group selected from the group consisting of acetal groups, ketal groups, ether groups, and silyl ethers groups.

9. A positive-working photosensitive composition of claim 7 wherein $R^1$ is selected from the group consisting of the groups

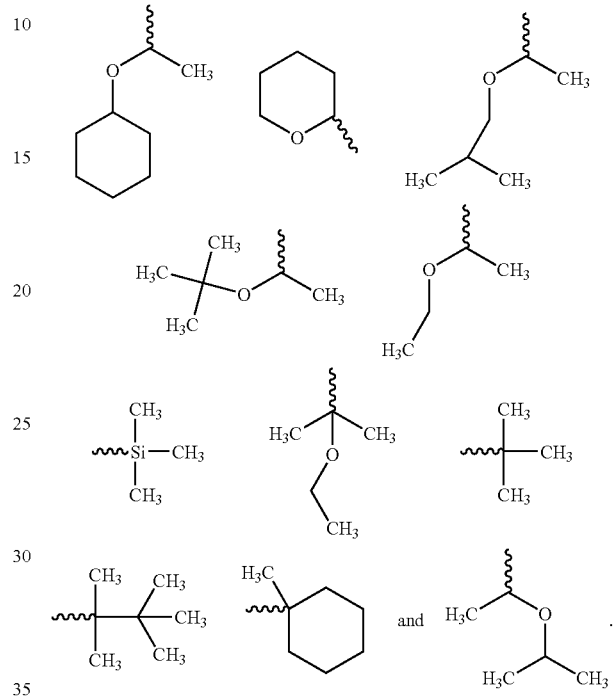

10. A positive-working photosensitive composition according to claim 7 wherein $R^2$ in combination with the portions of B forms a group selected from the group consisting of an acid sensitive acetal group and an acid sensitive ester group.

11. A positive-working photosensitive composition according to claim 7 wherein the group B—O—$R^2$ is selected from the group consisting of

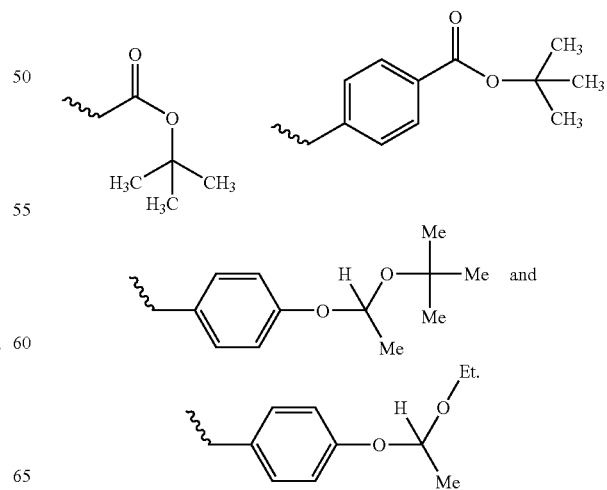

12. A positive-working photosensitive composition of claim 7 wherein $R^1$ in combination with the O atom attached to $Ar^1$ forms an acetal group and R is an organic group having a carbonyl group attached directly to the terminal NH of the polymer.

13. A positive-working photosensitive composition of claim 7 wherein the photoacid generator is selected from the group consisting of oxime sulfonates, sulfonium salts and iodonium salts.

14. A positive-working photosensitive composition of claim 12 wherein the photoacid generator is selected from the group consisting of oxime sulfonates and sulfonium salts.

15. A positive-working photosensitive composition of claim 7 additionally comprising an adhesion promoter.

16. A process for the preparation of a heat-resistant relief image comprising the steps of:
   a) coating on a substrate, a heat resistant positive-working photosensitive composition of claim 7, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

17. A process for the preparation of a heat-resistant relief image comprising the steps of:
   (a) coating on a substrate, a heat resistant positive-working photosensitive composition of claim 8, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

18. A process for the preparation of a heat-resistant relief image comprising the steps of:
   (a) coating on a substrate, a heat resistant positive-working photosensitive composition of claim 9, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

19. A process for the preparation of a heat-resistant relief image comprising the steps of:
   (a) coating on a substrate, a heat resistant positive-working photosensitive composition of claim 10, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

20. A process for the preparation of a heat-resistant relief image comprising the steps of:
   (a) coating on a substrate, a heat resistant positive-working photosensitive composition of claim 11, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

21. A process for the preparation of a heat-resistant relief image comprising the steps of:
   (a) coating on a substrate, a heat resistant positive-working photosensitive composition of claim 12, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

22. A process for the preparation of a heat-resistant relief image comprising the steps of:
   (a) coating on a substrate, a heat resistant positive-working photosensitive composition of claim 13, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

23. A process for the preparation of a heat-resistant relief image comprising the steps of:
   (a) coating on a substrate, a heat resistant positive-working photosensitive composition of claim 14, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and
   (e) baking said developed substrate at an elevated temperature to convert the polybenzoxazole precursor to a polybenzoxazole.

24. A process for the preparation of a heat-resistant relief image comprising the steps of:
   (a) coating on a substrate, a heat resistant positive-working photosensitive composition of claim 15, thereby forming a coated substrate;
   (b) exposing said coated substrate to actinic radiation;
   (c) post exposure baking said coated substrate at an elevated temperature;
   (d) developing said coated substrate with an aqueous developer, thereby forming a developed substrate; and (e) baking said developed substrate at an elevated temperature to convert the polybenzoxazole precursor to a polybenzoxazole.

25. A process for the preparation of a heat-resistant relief image of claim 16 wherein the substrate of step (a) is treated with an adhesion promoter before being coated with the positive-working photosensitive composition.

26. A process for the preparation of a heat-resistant relief image of claim 25 wherein the substrate is treated with an adhesion promoter selected from the group consisting of vinylalkoxysilanes, methacryloxalkoxysilanes, mercaptoalkoxysilanes, aminoalkoxysilanes, epoxyalkoxysilanes and glycidoxyalkoxysilanes.

27. A process for the preparation of a heat-resistant relief image of claim 26 wherein the substrate is treated with an adhesion promoter selected from the group consisting of gamma-aminopropyltrimethoxy-silane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane.

28. A substrate having a patterned image produced by the process of claim 16.

29. A substrate having a patterned image produced by the process of claim 17.

30. A substrate having a patterned image produced by the process of claim 18.

31. A substrate having a patterned image produced by the process of claim 19.

32. A substrate having a patterned image produced by the process of claim 20.

33. A substrate having a patterned image produced by the process of claim 21.

34. A substrate having a patterned image produced by the process of claim 22.

35. A substrate having a patterned image produced by the process of claim 23.

36. A substrate having a patterned image produced by the process of claim 24.

37. A substrate having a patterned image produced by the process of claim 25.

38. A substrate having a patterned image produced by the process of claim 26.

39. A substrate having a patterned image produced by the process of claim 27.

40. An article of commerce having incorporated therein a patterned image of claim 28.

41. An article of commerce having incorporated therein a patterned image of claim 37.

42. An article of commerce of claim 40 wherein the item of commerce is selected from the group consisting of memory devices, logic devices and plating stencils.

43. An article of commerce having incorporated therein a patterned image of claim 36.

* * * * *